United States Patent [19]
Metlitsky et al.

[11] Patent Number: 5,233,170
[45] Date of Patent: * Aug. 3, 1993

[54] BAR CODE SYMBOL SCANNER UTILIZING MONITOR PHOTODIODE OF LASER DIODE PACKAGE AS A PHOTORECEIVER

[75] Inventors: Boris Metlitsky, Stony Brook; Mark Krichever, Hauppauge, both of N.Y.

[73] Assignee: Symbol Technologies, Inc., Bohemia, N.Y.

[*] Notice: The portion of the term of this patent subsequent to Feb. 16, 2010 has been disclaimed.

[21] Appl. No.: 786,661

[22] Filed: Nov. 1, 1991

Related U.S. Application Data

[63] Continuation-in-part of Ser. No. 510,979, Apr. 18, 1990.

[51] Int. Cl.⁵ .................................................. G06K 7/10
[52] U.S. Cl. .................................... 235/462; 235/472; 235/454; 235/455
[58] Field of Search ............... 235/462, 472, 454, 455; 359/365, 366, 691, 692, 794, 795

[56] References Cited

U.S. PATENT DOCUMENTS

| | | | |
|---|---|---|---|
| 4,251,798 | 2/1981 | Swartz et al. | 340/146.3 SY |
| 4,360,798 | 11/1982 | Swartz et al. | 340/146.3 AG |
| 4,369,361 | 1/1983 | Swartz et al. | 235/470 |
| 4,387,297 | 6/1983 | Swartz et al. | 235/462 |
| 4,409,470 | 10/1983 | Shepard et al. | 235/472 |
| 4,460,120 | 7/1984 | Shepard et al. | 235/472 |
| 4,496,831 | 1/1985 | Swartz et al. | 235/472 |
| 4,593,186 | 6/1986 | Swartz et al. | 235/472 |
| 4,673,805 | 6/1987 | Shepard et al. | 235/472 |
| 4,675,531 | 6/1987 | Clark et al. | 235/472 |
| 4,678,288 | 6/1987 | Lonsdale et al. | 235/472 |
| 4,736,095 | 4/1988 | Shepard et al. | 235/472 |
| 4,758,717 | 7/1988 | Shepard et al. | 235/472 |
| 4,760,248 | 7/1988 | Swartz et al. | 235/472 |
| 4,786,798 | 11/1988 | Lonsdale et al. | 235/472 |
| 4,806,742 | 2/1989 | Swartz et al. | 235/472 |
| 4,816,660 | 3/1989 | Swartz et al. | 235/472 |
| 4,825,057 | 4/1989 | Swartz et al. | 235/472 |
| 4,835,374 | 5/1989 | Swartz et al. | 235/472 |
| 4,897,532 | 1/1990 | Swartz et al. | 235/467 |
| 4,916,297 | 4/1990 | Tukada et al. | 235/462 |
| 5,013,156 | 5/1991 | Murphy | 356/432 |
| 5,015,831 | 5/1991 | Eastman et al. | 235/462 |
| 5,047,625 | 9/1991 | Iima et al. | 235/472 |

FOREIGN PATENT DOCUMENTS

| | | | |
|---|---|---|---|
| 0604990 | 10/1934 | Fed. Rep. of Germany | 350/481 |
| 0220614 | 8/1923 | United Kingdom | 350/481 |

*Primary Examiner*—William L. Sikes
*Assistant Examiner*—Toan Tran

[57] ABSTRACT

An optical reader/scanning system eliminates the need for and the use of a separate system receiver mounted exteriorly of a laser diode package. Instead, a monitor photodiode within the laser diode package is used as the system receiver. A fresnel lens increases the collection efficiency of the monitor photodiode. The fresnel lens may be mounted interiorly or exteriorly of the laser diode package.

19 Claims, 7 Drawing Sheets

BAR CODE SYMBOL SCANNER UTILIZING MONITOR PHOTODIODE OF LASER DIODE PACKAGE AS A PHOTORECEIVER

CROSS-REFERENCE TO RELATED APPLICATIONS

This application is a continuation-in-part of U.S. patent application Ser. No. 07/510,979, filed Apr. 18, 1990, and is related to U.S. patent application Ser. No. 07/193,265, now U.S. Pat. No. 5,144,120.

BACKGROUND OF THE INVENTION

1. Field of the Invention

This invention generally relates to an optical reader and an optical scanning system of the type which directs a laser beam from a laser diode package to a symbol for reflection therefrom, and which receives reflected laser light at a discrete photoreceiver located exteriorly of the package and, more particularly, to a compact arrangement in such readers and scanning systems which eliminates the use of and the need for such exterior discrete photoreceivers.

2. Description of Related Art

Various optical readers and optical scanning systems have been developed heretofore to optically read bar code symbols applied to objects in order to identify the object by electro-optically reading the symbol thereon. The bar code symbol itself is a coded pattern comprised of a series of bars of various widths and spaced apart from one another to bound spaces of various widths, said bars and spaces having different light-reflecting characteristics. The readers and scanning systems electro-optically decoded the coded pattern to a multiple alpha-numerical digit representation descriptive of the object. Scanning systems of this general type have been disclosed, for example, in U.S. Pat. Nos. 4,251,798; 4,387,297; 4,409,470; 4,845,350; 4,835,374 and 4,816,660, all of which have been assigned to the same assignee as the instant invention and are incorporated herein by reference thereto.

As disclosed in some of the above patents, a laser light beam was generated by a semiconductor laser diode package. The laser beam was directed at, and repetitively scanned across, a symbol to be read, and then at least a portion of the laser light reflected off the symbol was collected and detected by a photodetector receiver. The photodetector receiver was a discrete component mounted separately from the laser diode package. The photodetector receiver generated electrical analog signals of variable amplitude which corresponded to the variable intensity of the light reflected off the symbol. The analog signals were digitized and decoded into data descriptive of the symbol and, of course, of the object bearing the symbol.

Although the known readers and scanning systems which utilized a separate photodetector receiver were quite satisfactory in terms of performance, such use was disadvantageous in the context of making the reader/scanning system as light in weight, as small in size, as compact, and as inexpensive as possible. It would be desirable, particularly when the reader/scanning system was intended for handheld operation, to eliminate the use of a separate photodetector receiver without sacrificing reader/scanning system performance.

SUMMARY OF THE INVENTION

1. Objects of the Invention

It is a general object of this invention to advance the state of the art of readers and scanning systems operative for reading symbols having parts of different light reflectivity such as bar code symbols.

It is another object of this invention to eliminate the use of, and the need for, a separate photodetector receiver.

A further object of this invention is to provide a reader/scanning system of reduced weight, miniature size and low cost.

2. Features of the Invention

In keeping with these objects, and others which will become apparent hereinafter, one feature of this invention resides, briefly states, in a system for reading symbols having parts of different light reflectivity. The invention comprises an arrangement including a conventional laser diode package having laser chip means operative for emitting a forwardly-directed laser beam and a rearwardly-directed laser beam. It is the forwardly-directed laser beam which is directed along an optical path toward a symbol for reflection therefrom to generate reflected light.

The conventional laser diode package also has monitor photodiode means in optical communication with the rearwardly-directed laser beam. The monitor photodiode means is operative for generating an output power control signal for the laser chip means. The monitor photodiode means is actually part of a feedback loop and "watches" the power output of the laser chip means. The monitor photodiode means, together with the feedback loop, serve to maintain the power output of the laser chip means approximately constant.

In accordance with this invention, the monitor photodiode means is not only used to monitor the power output of the laser chip means, as is conventional, but, in a departure from the prior art, is also used as the photodetector receiver of the system. By using the monitor photodiode means as the system receiver, the need for, and the use of, a separate receiver are eliminated, thereby reducing the weight, size, and expense of the overall system.

In a conventional laser diode package, the laser chip means has front and rear facets optically aligned along an optical axis in the optical path. The forwardly-directed laser beam is concentric with this optical axis. The monitor photodiode means has a receiving opening which is conventionally spaced rearwardly behind the laser chip means and which is radially offset from the optical axis.

Hence, in order to utilize the monitor photodiode means as the system receiver, it is necessary to provide the arrangement with collector means operative for collecting and optically modifying at least a portion of the reflected light from the symbol, and also for directing the collected portion to the monitor photodiode means to generate an information signal descriptive of the symbol. The collector means may advantageously be one or more lenses or optical components in the return path of the reflected light. These optical components focus the collected portion onto the offset and rearwardly-spaced receiving opening of the monitor photodiode means.

The use of the monitor photodiode means as the system receiver also requires that the arrangement be provided with signal processor means for separating the control and information signals, and for separately processing said signals. The separation of the control and information signals is necessary due to the "double duty" now required of the monitor photodiode means.

It will be noted that the control and information signals have different electrical characteristics. The output power control signal generated by the monitor photodiode means, which is "watching" the rearwardly-directed laser beam of the laser chip means, is essentially a DC signal, i.e. a voltage signal having a generally constant amplitude. On the other hand, the information signal generated by the monitor photodiode means is an analog AC signal, i.e. a voltage signal having a variable amplitude. The DC and AC signals can be advantageously separated by filter means, and separately processed. The AC information signal is thereupon digitized and decoded into data descriptive of the symbol. The DC control signal is separately conveyed to a current controller the fork loop operative, as described above, for controlling a power supply for the monitor photodiode means as a function of the sensed electrical current.

In one advantageous embodiment, wherein the system is used as a bar code symbol scanner, focusing means are provided in the optical path for directing and optically modifying the forwardly-directed laser beam to form a beam spot on the symbol. Scanning means are also provided in the optical path, and are operative for scanning the beam spot in a scan across the symbol.

Advantageously, the focusing means includes a positive focusing lens and an aperture stop. The aforementioned collector means advantageously includes a negative collecting lens having a clearance opening located in the optical path. The focusing means directs the forwardly-directed laser beam through the positive lens, the aperture stop and the clearance opening prior to impinging on the symbol.

As for the return path along which the collected portion of the reflected light is directed, the negative collecting lens, in combination with the positive lens, are employed for directing the collected light portion to the offset receiving opening of the monitor photodiode means.

Rather than requiring the monitor photodiode means to perform "double duty" as described above, it is sufficient if the monitor photodiode means is used only for the "single duty" of detecting the collected portion of the reflected light to generate the information signal. The other duty of monitoring the power output of the laser chip means can be performed by using the electrical characteristics of junction lasers. An electrical circuit monitors the AC voltage and the AC current of the laser diode, and generates a bias current-needed to operate the laser diode above a threshold level independently of the temperature and age of the laser diode. For details, reference can be had to "an Automatic Bias Control (ABC) Circuit for Injection Lasers", by A.Albanese, The Bell System Technical Journal, Vol. 67, No. 5, May–June 1978.

The aforementioned laser diode package, focusing means and the collector means are advantageously supported on and by a common support. The support may be a hand-held wand, a stand-alone workstation, a built-in laser scanning installation, or a hand-held laser scanning head. The support may also be mounted on the aforementioned scanning means in order to constitute a scan module of compact size that can be fitted into a housing.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE PREFERRED EMBODIMENTS

Figure 1:
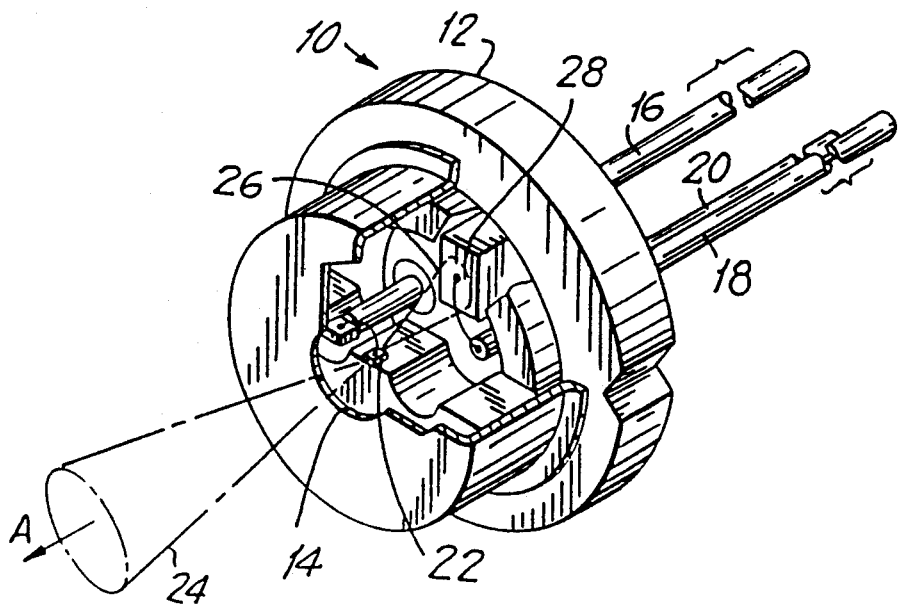
FIG. 1 is an enlarged, partly broken-away, front perspective view of a laser diode package.

Referring now to the drawings, reference numeral 10 generally identifies a conventional laser diode package comprising a casing 12, a front opening 14, and rear terminals 16, 18, 20 extending rearwardly of the casing. A laser chip 22 having a front facet emits a forwardly-directed generally-conical laser beam 24 along an optical path through the front opening 14 in a forward direction, as depicted by the arrow A. The laser chip also has a rear facet through which a rearwardly-directed generally-conical laser beam 26 is emitted into the casing 12 in a countercurrent direction to the arrow A. The front and rear facets are aligned along a common boresight or optical axis.

Figure 2:
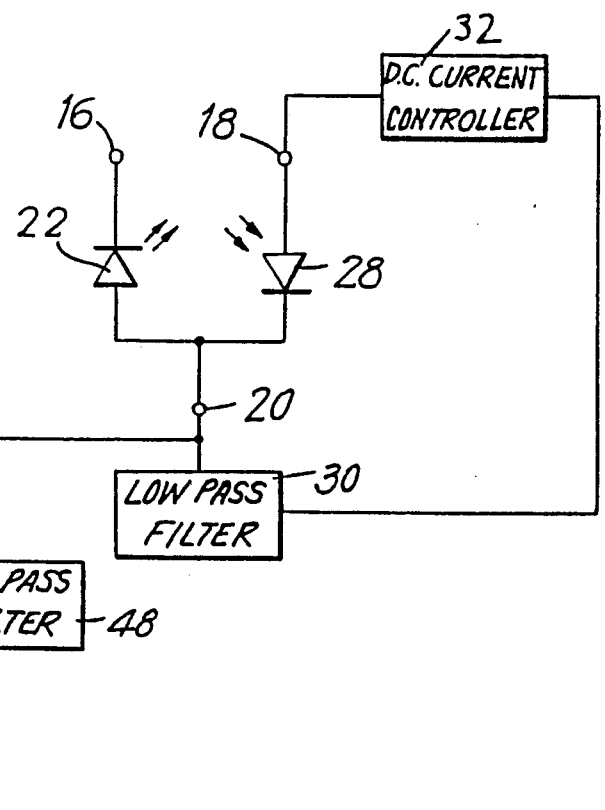
FIG. 2 is an electrical schematic block diagram showing the electrical connections for the laser diode package of FIG. 1.

A monitor photodiode 28 is also mounted within the casing 12 rearwardly of the laser chip 22, and also radially offset from the optical axis. The monitor photodiode 28 is, as shown in FIG. 2, part of a control feedback loop which monitors the output power of the laser chip and controls the output power to have a generally constant value.

Terminal 16 is connected to the cathode of the laser chip 22, and is electrically grounded. The anode of the monitor photodiode 28 is connected to terminal 18. A low pass filter 30 is electrically connected to supply terminal 20 which is electrically connected to both the anode of the laser chip and the cathode of the monitor photodiode.

As is conventional in laser diode packages, a DC current controller 32 is electrically connected in the feedback loop between the terminal 18 and the supply terminal 20. The monitor photodiode "watches" the rearwardly-directed beam 26. When the current controller 32 senses a decrease in electrical current passing through the monitor photodiode 28, the controller 32 increases the electrical current which is delivered to the laser chip, and vice versa. In this way, the power output of the laser chip is maintained essentially constant.

The laser diode package 10, as described so far, is entirely conventional, and is used as a laser light source in systems of the type disclosed in the aforementioned patents. Thus, as disclosed in, for example, U.S. Pat. No. 4,816,660, the emitted forwardly-directed laser beam 24 is directed through a positive focusing lens 34, e.g. a plano-convex lens, and an aperture stop 36. The focusing lens 34 and aperture stop 36 together serve to focus the laser beam 24 to a beam spot at a reference plane located a predetermined distance away from the laser chip. As is conventional in this art, the symbol to be read is located in the vicinity of this reference plane. In a scanner embodiment, a scanning means is operative for repetitively sweeping the beam spot across the symbol in any desired scan pattern.

As also taught by the aforementioned patents, a separate receiver, e.g. one or more photodiodes, is separately mounted away from the laser diode package 10 to collect at least a portion of the light reflected off the symbol. Now, in accordance with this invention, the use of one or more separate photodiodes is eliminated and, instead, the monitor photodiode 28 within the laser diode package 10 is used as the light receiver from which information relating to the symbol can be determined.

To use the monitor photodiode 28 as the receiver, the reflected light is collected and directed to a receiving opening of the monitor photodiode. Since the monitor photodiode is deliberately spaced rearwardly of, and radially offset from, the laser chip to prevent light reflected from the monitor photodiode from getting back into the internal cavity of the laser chip and causing noise in the laser output, a negative collecting lens 38 is positioned in the optical path in order to focus the reflected light onto the monitor photodiode. However, setting the negative collecting lens 38 in the optical path will change the focal length of the positive focusing lens and, hence, interfere with the forwardly-directed beam 24 and change the focusing parameters of the optical assembly.

To prevent changing the focusing parameters, a clearance passage 40 centered on the optical axis is formed in and through the negative collecting lens 38. The clearance passage 40 permits the forwardly-directed laser beam 24 to pass unobstructedly through and past the negative lens 38 prior to impingement on the symbol. In the return path, the returning reflected light 42 is optically modified by the negative lens 38 in combination with the positive lens 34 to focus the reflected light 42 onto the monitor photodiode. The lenses 38, 34 have an equivalent focal length equal to the distance between the lens 34 and the monitor photodiode.

Figures 3, 4:
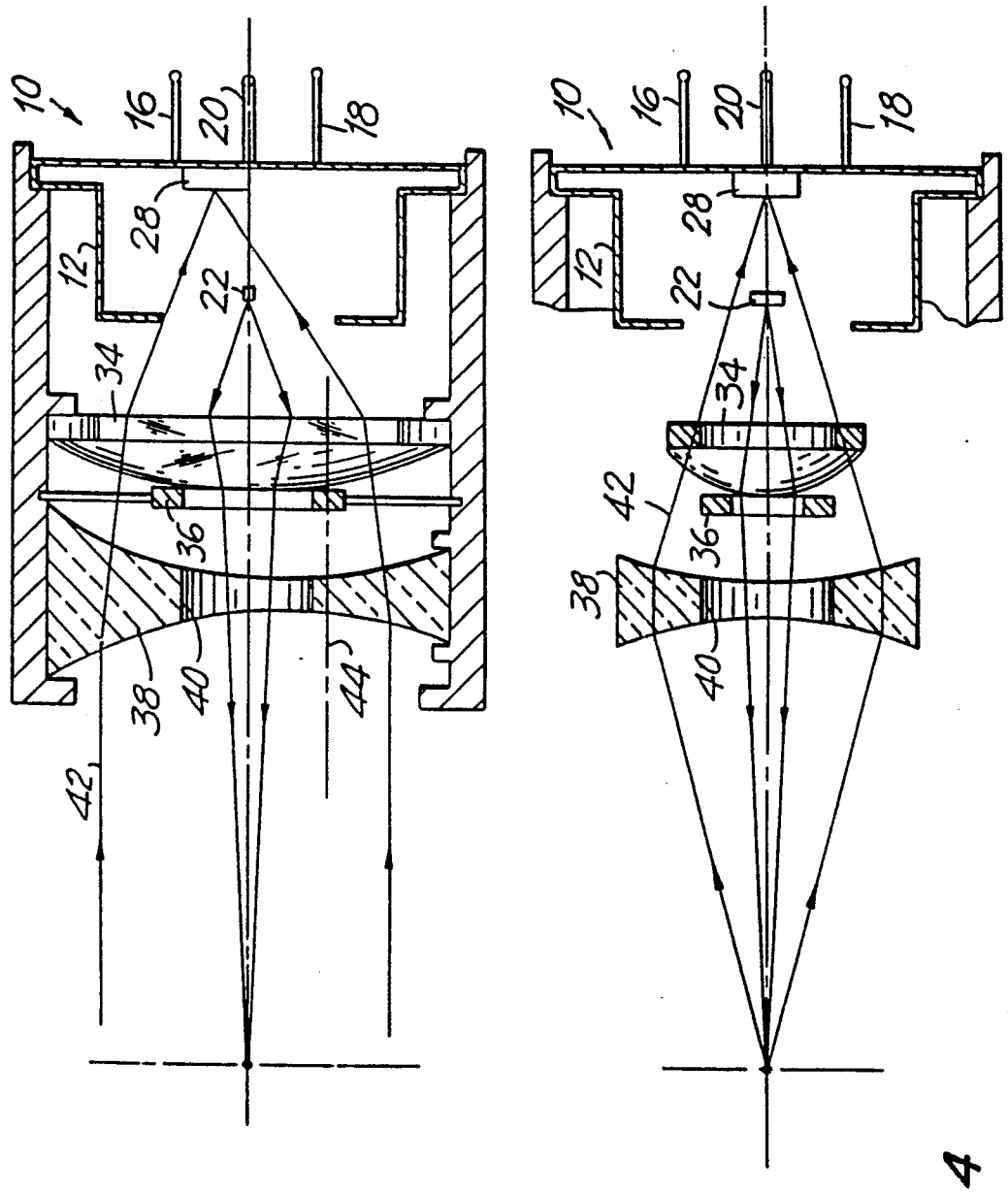
FIG. 3 is a side sectional view of an arrangement according to this invention.
FIG. 4 is a diagrammatic top plan view of the arrangement of FIG. 3.
Figure 5:
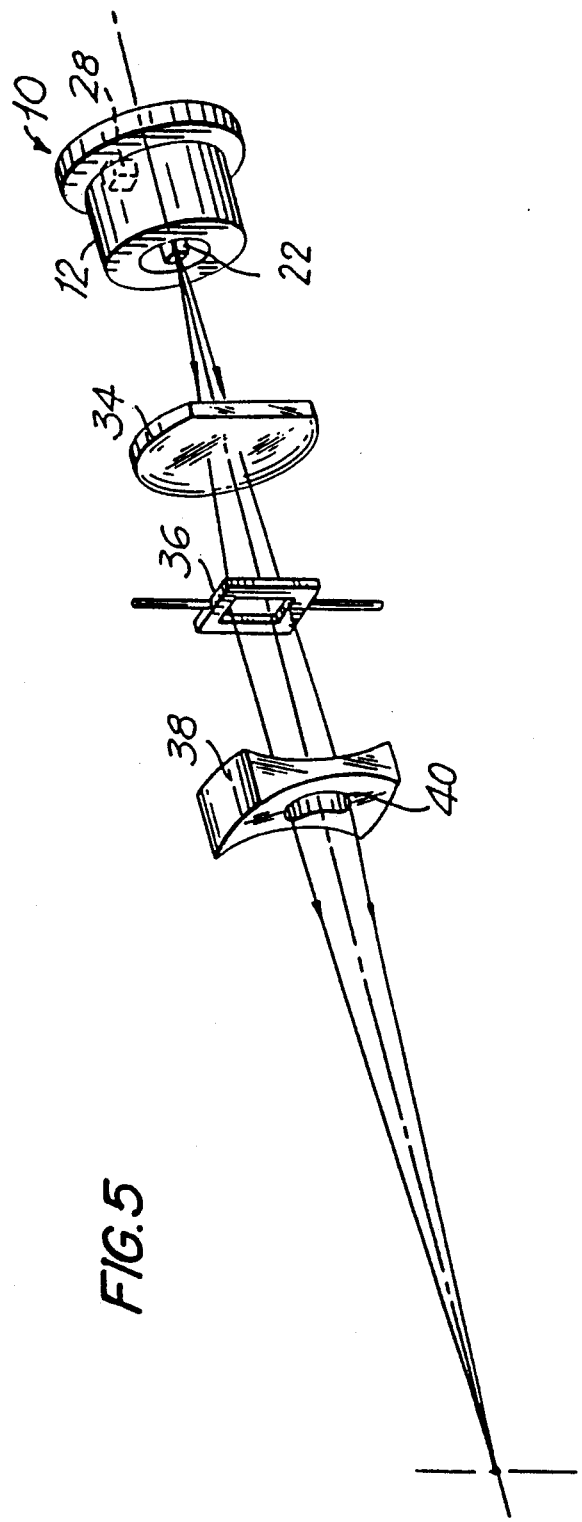
FIG. 5 is an exploded perspective view of the individual components of FIG. 4.

As best shown in FIGS. 4 and 5, in a preferred embodiment, the size of the aperture in the aperture stop 36 is about 1 mm as considered along a horizontal scan direction. According to previous proposals, the focusing lens 34 is circular and has a diameter of about 4 mm. The optical properties or focal length of the focusing lens in its central region, i.e. within a 1 mm area, around the optical axis are kept constant. The exterior surrounding portions of the focusing lens can be provided with different optical properties, e.g. a positive lens having a focal length equal to the distance between the focusing lens 34 and the monitor photodiode.

As described so far, the rearward position of the monitor photodiode is compensated for by either the negative collecting lens 38 together with the focusing lens 34, or a focusing lens having a central region and an exterior surrounding region, each region having different optical properties. To compensate for the radial offset, the negative collecting lens 38 is asymmetrically positioned relative to the optical axis. As best shown in FIG. 3, the central axis 44 of the negative lens 38 is shifted relative to the optical axis.

The monitor photodiode 28 now performs two functions. The first is to "watch" the rearwardly-directed beam of the laser chip and generate a power output control signal. The second function is to detect an information signal descriptive of the symbol in a manner analogous to a system photodetector of the prior art. Due to the superposition of the control and information signals, this invention further comprises electrical circuitry for separating the control and information signals and for separately processing said signals.

The rearwardly-directed laser beam 26 is detected as a DC signal, i.e. a voltage having a constant amplitude. The reflected light 42 is detected as an electrical analog AC signal, i.e. a voltage signal having a varying amplitude. The separation of the AC and DC signals is advantageously achieved, as best shown in FIG. 2, by the low pass filter 30 operative for allowing the DC signal to pass to the controller 32, as well as a high pass filter 48 operative for allowing the AC signal to pass to an analog-to-digital processor 50. The processor 50 digitizes the AC signal into a digitized signal which, in turn, is conveyed to a decoder 52 which is operative for decoding the digitized signal into data descriptive of the symbol. The analog-to-digital processor 50 and decoder 52 are entirely conventional, and reference can be had to the aforementioned patents for further details.

Figure 6:
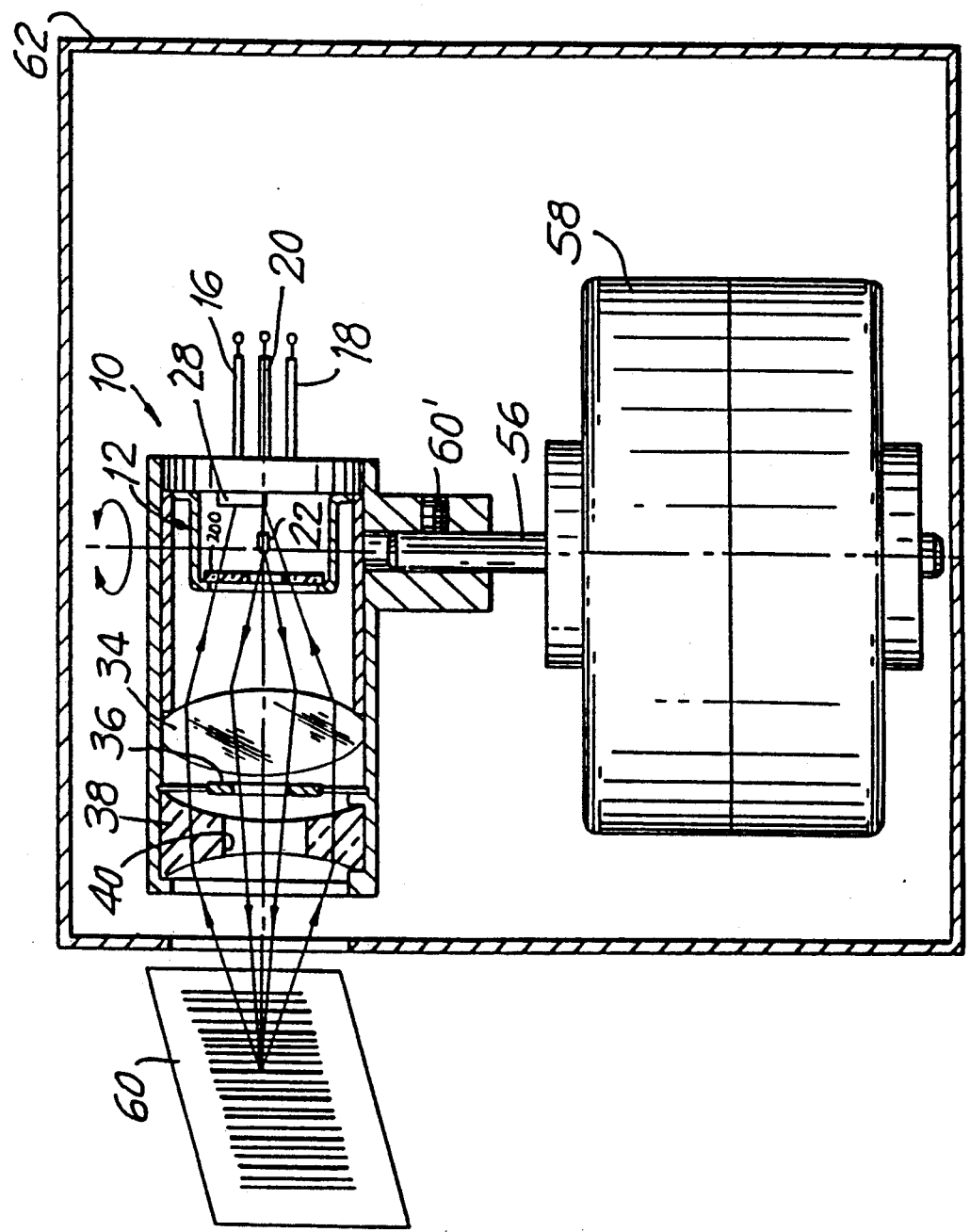
FIG. 6 is a partly sectioned side view of a scanning system for reading bar code symbols in accordance with this invention.

The arrangement described herein, which eliminates the use of a separate system receiver outside of the laser diode package, is particularly beneficial in the design of small and inexpensive readers and scanners. For example, as shown in FIG. 6, the laser diode package 10, positive lens 34, aperture stop 36, and negative lens 38 can advantageously be mounted in an optical tube 54 which, in turn, is mounted on a shaft 56 of an oscillatable motor 58. A set screw 60 fixedly positions the tube and the components supported thereby on the shaft 56. The oscillatable motor 58 is, for example, identical to that disclosed in U.S. Pat. No. 4,496,831. The oscillatable motor 58, of course, sweeps the tube 54 and the components supported thereby in a reciprocatable cyclical manner across a bar code symbol 60 to be read. The integrated assembly shown in FIG. 6 can advantageously be mounted in a housing 62. The housing 62 can be built into a countertop as a permanent fixed installation, or can be mounted above a support surface to serve as a stand-alone workstation, or can be equipped with a handle for hand-held operation.

Figure 7:
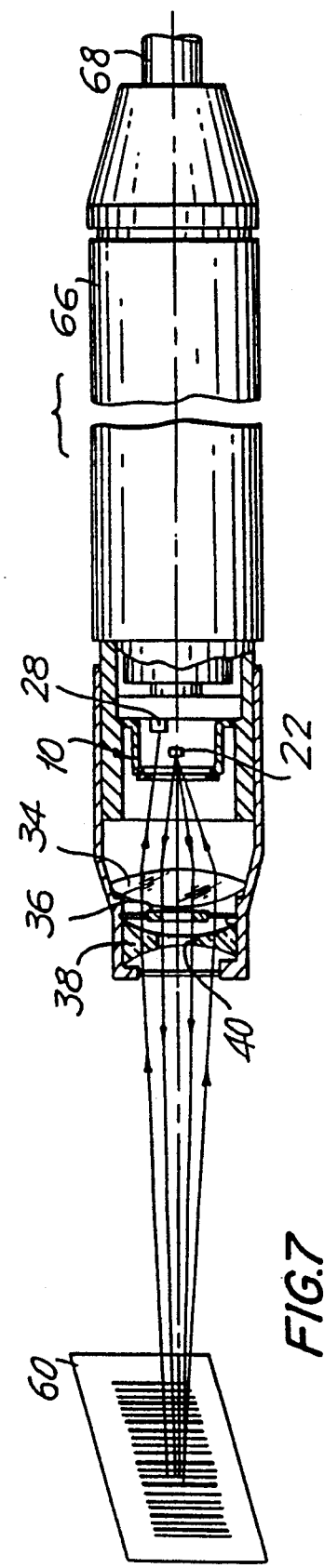
FIG. 7 is a partly broken-away side sectional view of a reader for reading bar code symbols in accordance with this invention.

Another advantageous embodiment is shown in FIG. 7 wherein the laser diode package 10, positive lens 34, aperture stop 36, and negative lens 38 are mounted in an optical tube 64 which, in turn, is fitted onto an end of a wand 66. The wand 66 is dimensioned to conveniently fit within one's hand, and is connected by means of a cable 68 to signal processing circuitry. The wand 66 is conventionally manually dragged across the symbol 60 to read the same.

Figure 8:
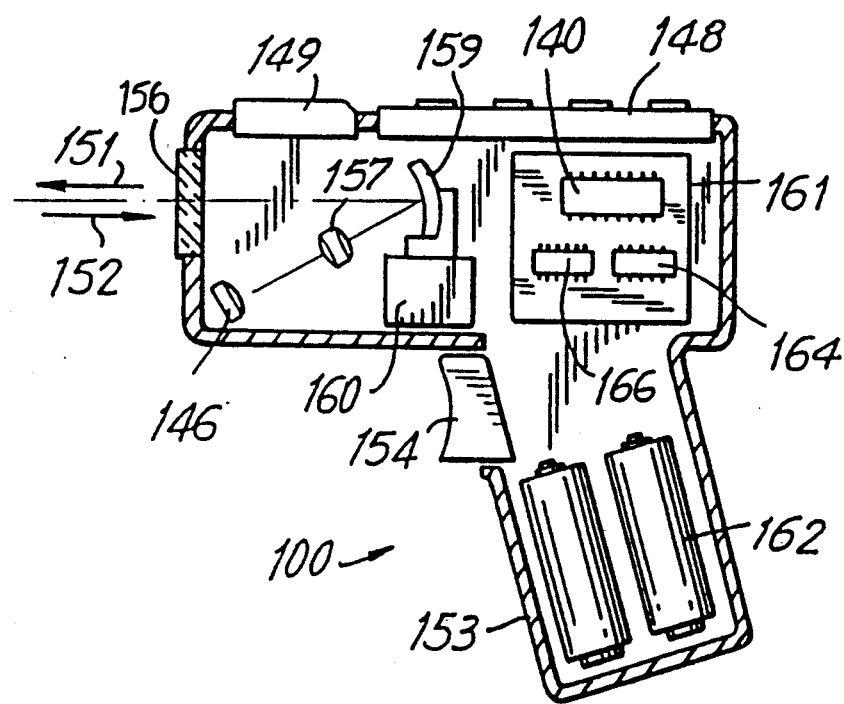
FIG. 8 is a side sectional view of another reader in which the present invention is incorporated.

The present invention may also be implemented in a hand-held, laser-scanning, bar code reader unit such as illustrated in FIG. 8. This hand-held device of FIG. 8 is generally of the style disclosed in U.S. Pat. No. 4,760,248, assigned to the assignee of the instant application, and also is similar to the configuration of a bar code reader commercially available as part No. LS-8100 from Symbol Technologies, Inc. Alternatively, or in addition, features of aforementioned U.S. Pat. Nos. 4,387,297 and 4,409,470 may be employed in constructing the bar code reader unit of FIG. 8. U.S. Pat. No. 4,760,248 is incorporated herein by reference.

An outgoing light beam 151 is generated in a reader unit 100, usually by a conventional laser diode package 146 or the like, and is directed to impinge upon a bar code symbol a few inches from the front of the reader unit. The outgoing beam 151 is scanned in a fixed linear scan pattern, and a user positions the hand-held unit so that this scan pattern traverses the symbol to be read. Reflected light 152 from the symbol, although usually detected by a separate light-responsive device in the reader unit, is now detected by the monitor photodiode within the package 146. The monitor photodiode produces serial electrical signals to be processed for identifying the bar code symbol.

The reader unit 100 is a gun-shaped device having a pistol-grip type of handle 153. A movable trigger 154 is employed to allow the user to activate the light beam 151 and detector circuitry when pointed at the symbol to be read, thereby saving battery life if the unit is self-powered. A lightweight plastic housing 155 contains the laser diode package, the optics and signal processing circuitry, and a central processing unit (CPU) 140 as well as a battery 162. A light-transmissive window 156 in the front end of the housing 155 allows the outgoing light beam 151 to exit and the incoming reflected light 152 to enter. The reader unit 100 is designed to be aimed at a bar code symbol by the user from a position where the reader unit 100 is spaced from the symbol, i.e. not touching the symbol or moving across the symbol. Typically, this type of hand-held bar code reader is specified to operate in the range of, perhaps, several inches.

As seen in FIG. 8, a suitable lens 157 (or multiple lens system) is used to collimate and focus the outgoing laser beam onto the bar code symbol at an appropriate reference plane, and this same lens 157 may be used to focus the incoming reflected light 152. The laser diode package 146 is positioned to introduce the light beam along the axis of the lens 157 toward an oscillating mirror 159 which is attached to a scanning motor 160 that is activated when the trigger 154 is pulled. If the light beam produced by the package 146 is not visible, an aiming light may be included in the reader unit. The aiming light may employ a partially-silvered mirror to introduce the light beam into the light path coaxially with the lens 157. The aiming light, if needed, produces a visible light spot which is scanned just like the laser beam. The user employs this visible light beam to aim the reader unit at the symbol before pulling the trigger 154.

Although the present invention has been described with respect to linear or single line bar code symbols, it is not limited to such embodiments, but may also be applicable to stacked or two-dimensional bar code symbols such as Code 49 and similar symbologies. It is conceivable that the present invention may also find application for use with various machine vision or optical character recognition applications in which information is derived from other types of indicia such as characters or from the surface characteristics of the article being scanned.

In all of the various embodiments, the elements of the reader unit may be assembled into a very compact package that allows the elements to be fabricated as a single printed circuit board or integral module. Such a module can interchangeably be used as the laser scanning element for a variety of different types of data acquisition systems. For example, the module may be alternately used in a hand-held scanner, a table-top scanner attached to a flexible arm or mounting extending over the surface of the table, or attached to the underside of the table top, or mounted as a subcomponent or subassembly of a more sophisticated data acquisition system.

The module would advantageously comprise a laser/optics/photodetector subassembly mounted on a support and a scanning element such as a rotating or reciprocating mirror. Control or data lines associated with such components may be connected to an electrical connector mounted on the edge or external surface of the module to enable the module to be electrically connected to a mating connector associated with other elements of the data acquisition system.

An individual module may have specific scanning or decoding characteristics associated with it, e.g. operability at a certain working distance, or operability with a specific symbology or printing density. The characteristics may also be defined through the manual setting of control switches associated with the module. The user may also adapt the data acquisition system to scan different types of articles, or the system may be adapted for different applications by interchanging modules on the data acquisition system through the use of the simple electrical connector.

The scanning module described above may also be implemented within a self-contained data acquisition system including one or more such components as a keyboard 148, a display 149, data storage 164, application software 166, and data bases. Such a system may also include a communications interface to permit the data acquisition system to communicate with other components of a local area network or with the telephone exchange network, either through a modem or an ISDN interface, or by low power radio broadcast from the portable terminal to a stationary receiver.

Figure 9:
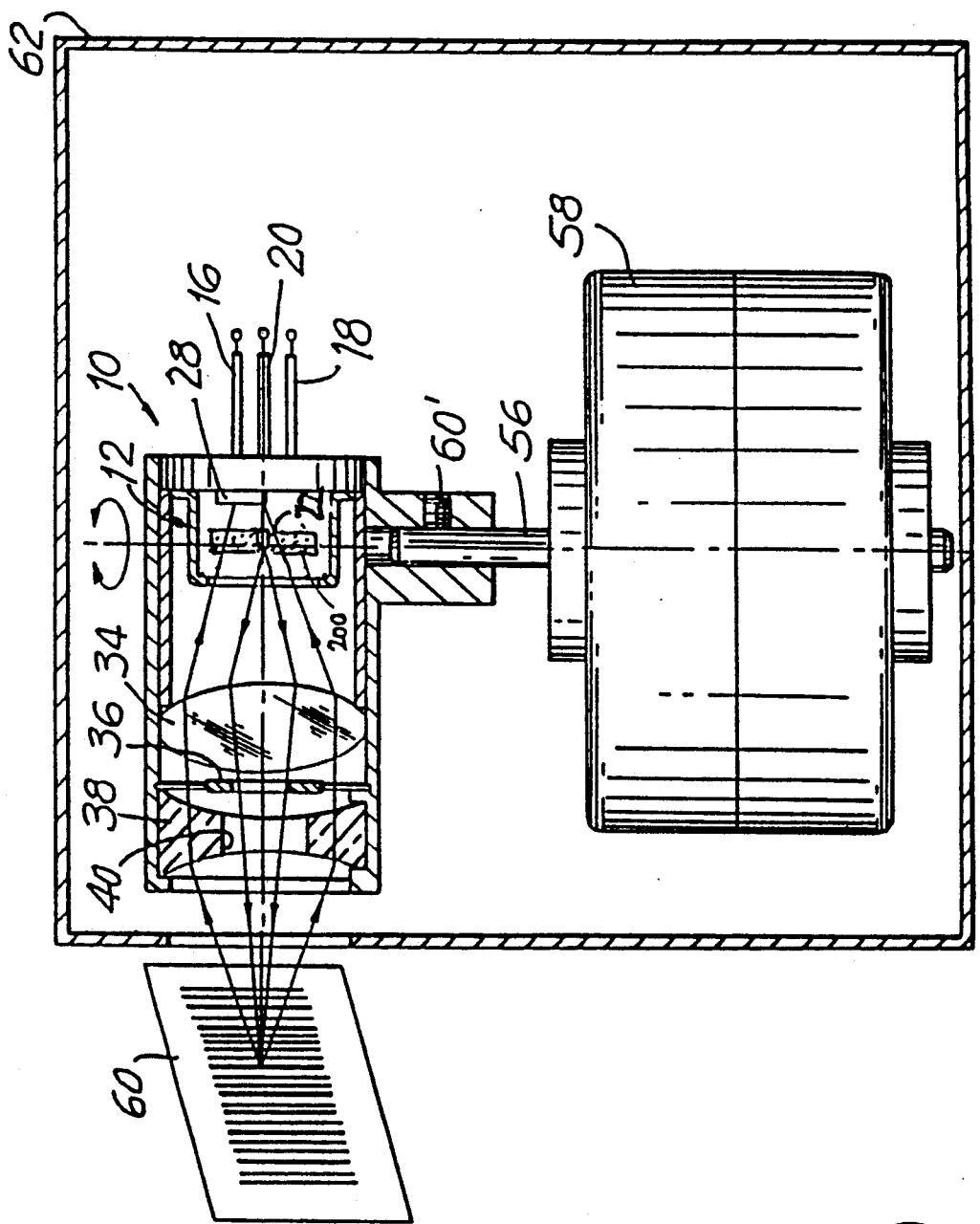
FIG. 9 is a view analogous to FIG. 6 of a modified scanning system.
Figure 10:
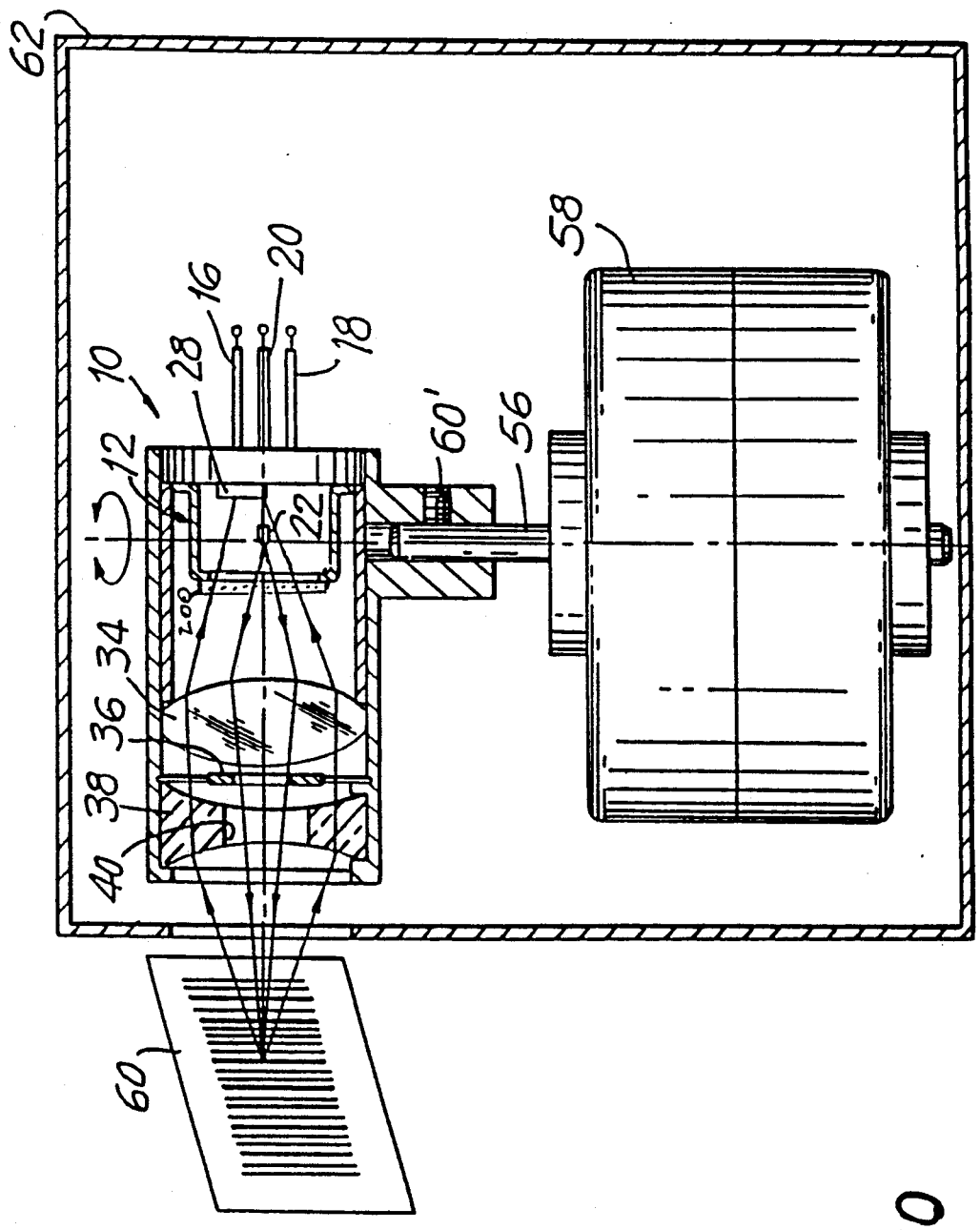
FIG. 10 is another view analogous to FIG. 6 of another modified scanning system.

A fresnel lens 200 may be used to increase the efficiency of light collection. Thus, as shown in FIG. 6, a fresnel lens 200 is mounted inside the casing 12 behind the front opening 14. Alternatively, as shown in FIG. 9, the fresnel lens surrounds the laser chip 22. As shown in FIG. 10, the fresnel lens is mounted outside the casing 12 in front of the front opening of the casing 12. In each case, the fresnel lens focuses the returning reflected light onto the monitor photodiode 28. The fresnel lens can be located anywhere in the path of the reflected light. The mounting of the fresnel lens inside the casing makes for a very compact scanning system. The mounting of the fresnel lens at the front opening also helps to prevent contaminants from entering the casing. The fresnel lens is particularly of benefit when used with visible laser diodes.

It will be understood that each of the elements described above, or two or more together, also may find a useful application in other types of constructions differing from the types described above.

While the invention has been illustrated and described as embodied in a bar code symbol scanner utilizing monitor photodiode of laser diode package as a photoreceiver, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

We claim:

1. In a system for reading symbols having parts of different light reflectivity, an arrangement comprising:
    (a) a laser diode unit having laser chip means operative for emitting a forwardly-directed laser beam along an optical path toward a symbol for reflection therefrom to generate reflected light, and a rearwardly-directed laser beam, said laser diode unit also having monitor photodiode means in optical communication with the rearwardly-directed laser beam;
    (b) collector means including a fresnel lens for collecting and optically modifying at least a portion of the reflected light from the symbol, and for directing the collected portion to the monitor photodiode means to generate an information signal descriptive of the symbol; and
    (c) signal processor means for processing the information signal into data descriptive of the symbol.

2. The arrangement as recited in claim 1, wherein the monitor photodiode means is operative for generating an output power control signal for the laser chip means, and wherein the signal processor means is operative for separating and separately processing the control and information signals.

3. The arrangement as recited in claim 1, wherein the unit has a housing bounding an interior in which the laser chip means and the monitor photodiode means are mounted in a spaced-apart relationship.

4. The arrangement as recited in claim 3, wherein the laser chip means has front and rear facets optically aligned along an optical axis in the optical path, and wherein the monitor photodiode means has a receiving opening radially offset from the optical axis and spaced rearwardly behind the laser chip means.

5. The arrangement as recited in claim 4; and further comprising focusing means for directing and optically modifying the forwardly-directed laser beam along the optical path to form a beam spot on the symbol, and means for scanning the beam spot in a scan across the symbol.

6. The arrangement as recited in claim 5, wherein the collector means directs the collected portion to the offset receiving opening of the monitor photodiode means.

7. The arrangement as recited in claim 6, wherein the focusing means includes a positive focusing lens and an aperture stop, and wherein the collector means includes a negative collecting lens having a clearance opening located in the optical path, and wherein the focusing means directs the forwardly-directed laser beam through the positive lens, the aperture stop and the clearance opening prior to impinging on the symbol.

8. The arrangement as recited in claim 7, wherein the negative lens together with the positive lens direct the collected portion to the offset receiving opening of the monitor photodiode means.

9. The arrangement as recited in claim 2, wherein the output power control signal generated by the monitor photodiode means is a voltage signal having a generally constant amplitude; and wherein the information signal generated by the monitor photodiode means is a voltage signal having a variable amplitude; and wherein the signal processor means includes filter means operative for discriminating between the generally constant voltage signal and the variable voltage signal.

10. The arrangement as recited in claim 9, wherein the signal processor means includes means for converting the variable voltage signal to a digitized signal, and means for decoding the digitized signal into a decoded signal.

11. The arrangement as recited in claim 9, wherein the signal processor means includes means for sensing electrical current flowing through the monitor photodiode means, and means for controlling a power supply for the monitor photodiode means as a function of the sensed electrical current.

12. The arrangement as recited in claim 1; and further comprising focusing means for directing and optically modifying the forwardly-directed laser beam along the optical path to form a beam spot on the symbol; and wherein the laser diode unit, the focusing means and the collector means are supported by a common support.

13. The arrangement as recited in claim 12, wherein the housing has a handle for hand-held operation.

14. The arrangement as recited in claim 13; and further comprising means for scanning the beam spot in a scan across the symbol; and wherein the laser diode unit, the focusing means and the collector means are supported by the scanning means to constitute a compact laser scanning module.

15. The arrangement as recited in claim 1, wherein the unit has a housing bounding an interior, and wherein the fresnel lens is mounted within the interior of the housing.

16. The arrangement as recited in claim 15, wherein the fresnel lens is mounted on, and surrounds, the laser chip means.

17. The arrangement as recited in claim 15, wherein the housing has a front opening, and wherein the fresnel lens spans the front opening.

18. The arrangement as recited in claim 1, wherein the unit has a housing having a front opening, and wherein the fresnel lens spans the front opening exteriorly of the housing.

19. The arrangement as recited in claim 1, wherein the laser chip means is a visible laser diode.

* * * * *